United States Patent [19]

Woodhouse

[11] Patent Number: 4,973,914
[45] Date of Patent: Nov. 27, 1990

[54] DIGITIZED SYNCHRONOUS DEMODULATOR

[75] Inventor: Christopher E. Woodhouse, Baltimore, Md.

[73] Assignee: The United States of America as represented by the Administrator of the National Aeronautics and Space Administration, Washington, D.C.

[21] Appl. No.: 418,612

[22] Filed: Oct. 10, 1989

[51] Int. Cl.$^5$ ............................................. H03D 1/00
[52] U.S. Cl. .................................... 329/363; 328/151
[58] Field of Search ...................... 329/311, 347, 363; 328/150, 151; 307/350, 352, 353, 355

[56] References Cited

U.S. PATENT DOCUMENTS 3,925,732  12/1975  Tanaka et al. .................. 329/311 X Primary Examiner—Siegfried H. Grimm
Attorney, Agent, or Firm—R. Dennis Marchant; John R. Manning; Ronald F. Sandler

[57] ABSTRACT

A digitized synchronous demodulator is constructed entirely of digital components including timing logic, an accumulator, and means to digitally filter the digital output signal. Indirectly, it accepts, at its input, periodic analog signals which are converted to digital signals by traditional analog-to-digital conversion techniques. Broadly, the input digital signals are summed to one of two registers within an accumulator, based on the phase of the input signal and mediated by timing logic. At the end of a predetermined number of cycles of the inputted periodic signals, the contents of the register that accumulated samples from the negative half cycle is subtracted from the accumulated samples from the positive half cycle. The resulting difference is an accurate measurement of the narrow band amplitude of the periodic input signal during the measurement period. This measurement will not include error sources encountered in prior art synchronous demodulators using analog techniques such as offsets, charge injection errors, temperature drift, switching transients, settling time, analog to digital converter missing code and linearity errors.

9 Claims, 2 Drawing Sheets

DIGITIZED SYNCHRONOUS DEMODULATOR

ORIGIN OF THE INVENTION

The invention described herein was made by an employee of the United States Government, and may be manufactured and used by or for the Government for government purposes without the payment of any royalties thereon or therefor.

TECHNICAL FIELD

This invention pertains to synchronous demodulators or synchronous detectors.

BACKGROUND ART

Historically, band pass filters were used to selectively amplify periodic signals in noise. This technique has the limitation that, if the filter bandwidth is made extremely small to improve noise rejection, the filter will have a tendency to "ring". Such resonant response makes a narrow band filter unsuitable for some types of signal processing situations. If the filter bandwidth is made relatively wide to avoid the ringing problem, then the noise rejection performance of the filter is degraded.

A second technique for detecting periodic signals in noise involves the use of a phase locked loop (PLL). The PLL is a closed loop control system consisting of a phase difference-to-voltage converter which drives a voltage-to-frequency converter which, in turn, provides a second input to the phase difference-to-voltage converter. While the PLL technique of detecting signals in noise works well in some applications, it is complex and less efficient than other techniques in certain other applications.

A third technique for detecting periodic signals in noise involves the use of a synchronous demodulator (SD). In the SD technique, a periodic switching function in synchronism with the periodic signal to be detected, i.e., a clock, is used to provide a switching modulation of the noisy periodic input signal. The resulting modulated signal is customarily filtered through a low pass filter, leaving only the dc component of the modulation process at the output of the filter. The magnitude of the dc component is proportional to the amplitude of the fundamental frequency component of the periodic signal to be detected. The SD process is equivalent to the time cross correlation, at zero time delay, of a noisy signal with a square wave having the same period as that of the fundamental period of the signal.

Numerous SD circuits have been devised for the purpose of synchronously detecting periodic signals in noise. A typical synchronous demodulator circuit consists of an amplifier, a switch, and a low pass filter. The gain of the amplifier can be switched alternately, for example, from +1 to −1, depending on the position of the switch, which is operated in synchronism with the input periodic signal to be detected. The positive and negative gains need not be one, as long as they are equal. In practice the switch customarily takes the form of a solid state switching circuit, employing either a JFET or a CMOS pass element. The operation of the electronic switch is customarily controlled by a logic input signal. Whatever the details of the switching element, it must provide the switching function described above. Usually some adjustment to correct for phase errors must be provided. The resultant demodulated signal at the output of the amplifier is a full-wave rectified version of the input signal, consisting of a series of positive half-sine loops. The resultant full-wave rectified signal is passed through a low pass filter, which attenuates the ac components of the full wave rectified signal and passes the dc component unattenuated. The bandwidth of the filter, e.g., an R-C circuit, would be somewhat less than the frequency of the periodic signal. The rectified output from the amplifier and the dc output of the LPF have amplitudes which are proportional to the amplitude of the original incoming sinusoidal signal. The process may be thought of as the linear multiplication of the input signal by a square wave signal of the same frequency, resulting in the production of Fourier frequency components at multiples of the signal frequency and at zero frequency. The low pass filter selectively passes the zero frequency component while attenuating all higher frequency components of the signal. Because the switch is operated in synchronism with the input signal, the signal is detected and a dc output is produced at the output of the LPF. Because any random noise at the input exhibits random phase with respect to the periodic operation of the switch, the low pass filter tends to average this random noise component to zero. The same is true for periodic input signals which are not phase coherent with the switching of the switch.

Any dc level superimposed on the periodic input signal results in the production, at the output, of a square wave component at the clock frequency. The low pass filter must be carefully designed to suppress, as much as possible, this square wave component, as well as the periodic components resulting from the full wave rectification of the input signal so that precise measurements can be made of the dc value of the low pass filter output. Regardless of the filter design, there will be a periodic component at the output which can limit the signal-to-noise ratio. Thus, the prior art SC produces an output signal having residual ac components resulting from two sources; the square wave signal produced at the output by any dc component at the input, and the full wave rectification signal at the output produced by the rectification function of the circuit on the periodic signal itself. Because a dc or very slowly varying ac signal is required for control purposes, an LPF is required at the SD output. The choice of the filter rise time or bandwidth involves a tradeoff. If the low pass filter rise time is made very large, the ripple may be attenuated to any degree desired, but the filter would have an unacceptably long rise time. If the filter time constant is made very small, it may have an acceptable rise time, but would not sufficiently attenuate the ripple components. Thus, the prior art SD will inherently produce ac components at the output which must be filtered, but any filter selection involves the above-described tradeoff. Therefore, in a practical sense, the prior art SD produces a control signal with significant errors, or alternatively, a control signal which is limited in response time.

Recently, a synchronous demodulator has been developed which includes a differential amplifier with two identical channels, one to each input where each channel receives an input signal which is switched in synchronism with a clock signal. In one embodiment of this synchronous demodulator, dc offsets at the input were eliminated from the output. There was a substantial reduction in ripple due to periodic components in the input signal. In a somewhat more complex embodiment, substantially all ripple due to periodic components in the input signal were eliminated. While these substantive problems have been addressed in this recent synchronous demodulator, the channels include averaging and hold functions which are carried out by RC circuitry that exhibit a finite rise time which may require an undesirable amount of time to change value, and the capacitors may introduce errors due to charge injection.

STATEMENT OF THE INVENTION

Accordingly, it is an object of this invention to provide an improved synchronous demodulator.

It is another object of this invention to provide an improved digitized synchronous demodulator which does not produce a periodic signal at its output when a dc signal is present at the input.

It is yet another object of this invention to provide an improved digitized synchronous demodulator which does not produce a periodic signal at its output when a periodic signal is present at the input.

It is another object of this invention to provide an improved digitized synchronous demodulator with increased demodulation speed.

It is yet another object of this invention to provide an improved digitized synchronous demodulator without charge injection errors.

It is still another object of this invention to provide an improved digitized synchronous demodulator without differential amplifier gain variation or offset.

It is still another object of this invention to provide an improved digitized synchronous demodulator without temperature caused drift.

It is still another object of this invention to provide an improved digitized synchronous demodulator without switching transient errors.

It is still another object of this invention to provide an improved digitized synchronous demodulator without missing code or analog to digital converter linearity errors.

Briefly, these and other objects are achieved by providing a synchronous demodulator structured completely with digital components, including a counter, an accumulator and timing logic which performs the functions of directing the appropriate portion of a digitized incoming periodic signal to the accumulator.

DETAILED DESCRIPTION OF THE INVENTION

Figure 1:
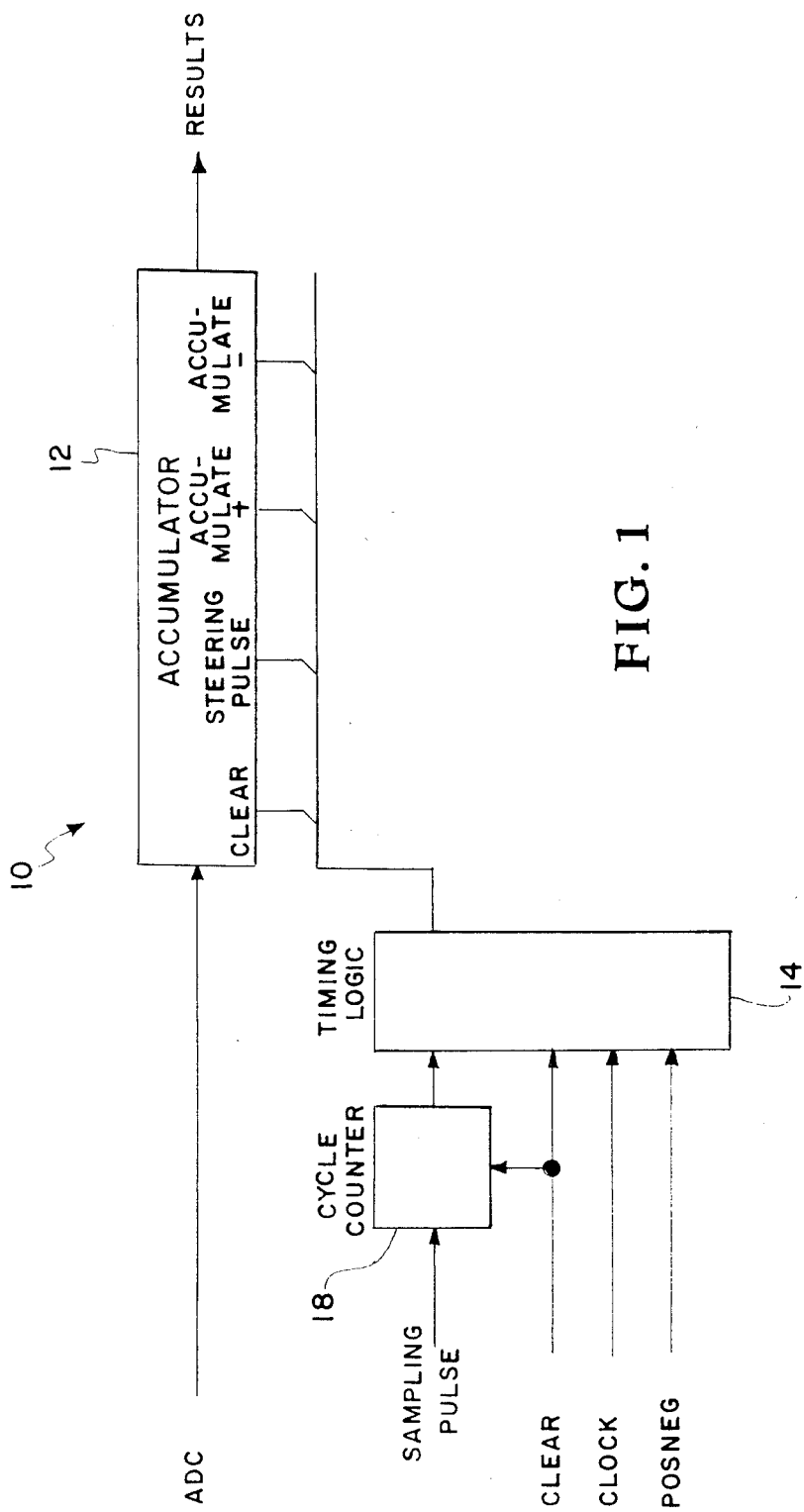
FIG. 1 is a block diagram representation of the synchronous demodulator of the instant invention.

Referring to FIG. 1, a block diagram is shown which depicts the digitized synchronous detector (SD), 10, of the instant invention. Shown are a plurality of inputs to the SD. The periodic input signal, the carrier, converted by an analog-to-digital converter (ADC, not shown), is shown as driving the signal input of an accumulator, 12. Additionally, there are four other inputs to the SD: POSNEG, CLOCK, SAMPLING PULSE, and CLEAR.

The clock signal, CLOCK, is shown driving timing logic 14. The clock signal is derived from a crystal-controlled logic oscillator (not shown), running at about 1 MHz. The clock controls, through a count down mechanism (not shown) the timing of the samples that will be taken to digitally quantify the incoming signal. The clock, after a suitable count-down, is also used to step a ROM (not shown), which, in turn, provides a digital representation of a sinusoid to the input of a digital-to-analog converter (DAC, not shown). The ROM is preprogrammed with calculated values of SIN (X), which, after proper signal processing (not shown), forms the sensor excitation signal, the carrier.

The POSNEG signal is developed logically from the same count down mechanism that provides addresses to the ROM and accurately reflects the phase of the output. POSNEG is positive if the phase of the carrier is between 0 and 180 degrees, and is zero if phase is between 180 and 360 degrees. The POSNEG signal is processed by the timing logic to provide inputs to the accumulator 12.

The sampling pulse input to timing logic 14 is derived from the system clock signal by a counter (not shown). It is a pulse coincident with the acquisition of a sample from the ADC which occurs at a preprogrammed rate of, for example, 512 times for each cycle of the periodic input signal.

The clear pulse is shown as one input which clears all registers and counters to their initialized state coincident or prior to the arrival of the first sample in the positive half cycle of the carrier signal. It is derived from a counter (not shown) and a user input (also not shown).

The cycle counter 18 is a counter which is programmed to produce a pulse when the desired number of cycles of the carrier signal have elapsed since the last clear.

The timing logic is employed to process the clock signal input, the sampling pulse input, POSNEG signal, and the output of the cycle counter 18 to provide two output signals: an accumulator enable pulse and a steering pulse.

The time from the end of the clear pulse through the end of the cycle counter preprogrammed count defines a measurement cycle. This will typically be an integral number of cycles of the carrier, in this embodiment, 16 cycles.

The timing logic will generate signals required to accumulate samples from the ADC to a positive half cycle register 22 when POSNEG is positive and to the negative half cycle register when POSNEG is zero. The timing logic outputs four signals. Clear is simply passed through timing logic to the accumulator. Steering pulse is derived from POSNEG. The accumulator + pulse is derived from the clock, the sample pulse, and clear and causes latching of data in the positive half cycle register of the accumulator. Similarly, accumulate − causes latching of data in the negative half cycle register. These last two signals occur on every cycle during their corresponding half cycle.

The timing logic may include suitable registers, gates, and counters to provide a programmable delay for the steering pulse. This delay would be necessary, for example, to compensate for delay (phase shift) of the ADC data due to phase shift caused by distributed capacity in the analog signal line which feeds the input to the ADC.

Figure 2:
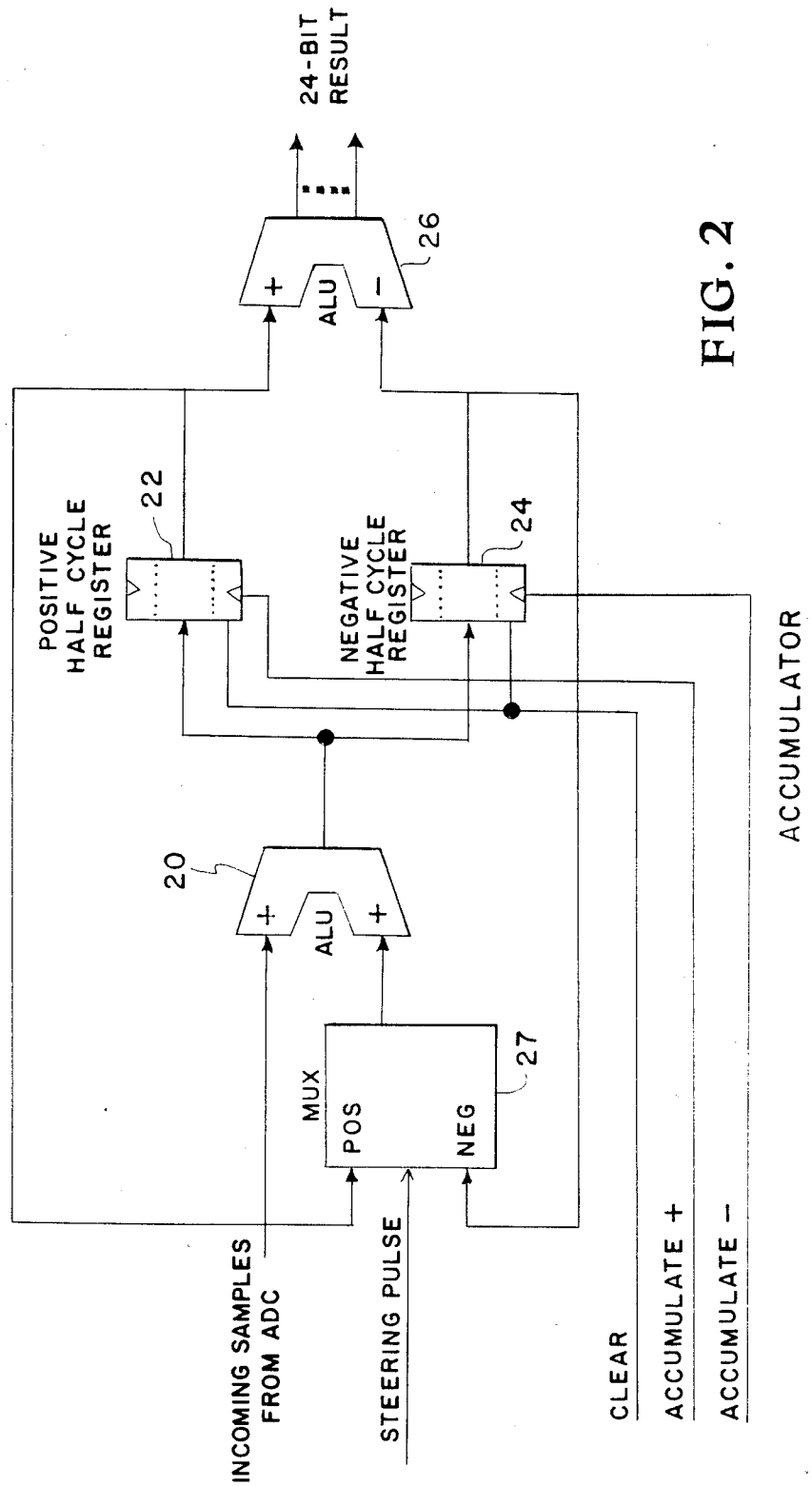
FIG. 2 is a block diagram representation of the accumulator employed in the synchronous demodulator of the instant invention.

One possible design of accumulator 12, shown in FIG. 1, is shown in FIG. 2. The overall function of the accumulator is to sum all samples from the ADC during the measurement cycle in each of two registers according to the phase of the carrier.

The incoming data from the ADC is extended to the necessary digital width, in this embodiment, 24 bits, and is applied to one side of a standard arithmetic logic unit (ALU) 20 of the appropriate width and that is set up for addition. The previous sample sum of the appropriate half cycle register is applied to the other side of the summing ALU 20 by way of digital multiplexor 27, which is selected by the steering pulse. In this way, the multiplexor acts as an SPDT switch controlled by the POSNEG signal, or the phase of the carrier.

During the positive half cycle, accumulate + signal then causes the sum of the previous data plus the new sample to be loaded in parallel into the positive half cycle register 22. Similarly, the accumulate − pulse will cause the data to be accumulated to the negative half cycle register 24.

The result of a measurement is the difference between the accumulated samples in the positive half cycle register and the negative half cycle register. It is important that the number of samples accumulated to each register is precisely the same. At the end of the measurement cycle, this result is available at the output of a second arithmetic logic unit 26 that is configured for subtraction and is connected to the outputs of the two half cycle registers.

The logical implementation of the invention, as shown in FIG. 1, is one way to accomplish a digitized synchronous demodulator. The broader aspect of the invention relates to the digital accumulation of data, however done, to produce an accumulated average of the rectified periodic input signal over a predetermined number of cycles of that input signal to produce certain advantageous functions. The advantages of this digital averaging approach over a similar analog approach are that there are no input offset errors or gain variations due to the use of analog differential amplifiers, because this system does not include an analog differential amplifier. Furthermore, the accumulation of large numbers of samples reduces the error contribution from the ADC. Moreover, digital averaging provides an estimate of the average of the rectified average of the input signal immediately at the end of a predetermined number of cycles of the periodic input signal. In an analog RC averaging system, times of the order of several time constants would be necessary to produce an output of comparable precision, i.e., the digital system is inherently faster than a comparable analog system. In addition, analog systems which employ capacitors for averaging and holding accumulated signal levels may experience errors due to charge injection. This kind of digital system inherently provides low pass filtering, the corner frequency being determined by the number of periodic input cycles accumulated after clearing the accumulator. The larger the number accumulated, the less error is inherent in the average, but the longer the response time to a real error signal present in the periodic input. This same dichotomy is inherent in the performance of an analog system.

There may be circumstances where a somewhat more complicated system may be desirable. The logic system may be modified by having the decoder produce enabling pulses that represent the quadrature elements of the periodic input signal. These elements would give information as to the phase relationship of the input signal with a reference source. In such an instance, one would have two sets of accumulators, one set for the in phase component of the periodic signal and the other set would process the quadrature, or pb 90 degree, component of the periodic signal.

This demodulator can be used in an instrument or control system that must detect and quantify very precisely, a periodic signal imbedded in noise, and produce outputs that may be used for monitoring or control, e.g. precision temperature control systems. Very rigorous specifications can be met with this system, where prior art systems would not suffice because of abovedescribed sources of error.

I claim:

1. A synchronous demodulator including: digital means to apply an incoming periodic signal to each of two channels, each of said channels including further means to compute and retain a signal which represents the average value of said incoming signal over a predetermined period of time; and, digital means to compute the difference between the said retained signals.

2. The synchronous demodulator of claim 1 wherein said digital means to apply an incoming periodic signal to each of two channels includes an accumulator.

3. The synchronous demodulator of claim 2 wherein said accumulator includes a means to clear said accumulator at the end of a predetermined number of cycles of said incoming periodic signal.

4. The synchronous demodulator of claim 3 wherein said accumulator includes a means to start accumulating.

5. The synchronous demodulator of claim 2 wherein said accumulator includes two registers, one register of each of said two channels.

6. The synchronous demodulator of claim 5 wherein said demodulator includes means for directing digitized portions of said incoming periodic signal to each of said two registers in a periodic fashion.

7. The synchronous demodulator of claim 6 wherein said means for directing includes a multiplexor which, in turn, is controlled by a phase derived signal.

8. The synchronous demodulator of claim 1 wherein said means to compute the difference between said retained signals includes an arithmetic logic unit.

9. The synchronous demodulator of claim 5 wherein said demodulator includes an arithmetic logic unit which is inputted with data from each of two said registers and thereafter subtracts the count in one of said registers from the count in the other of said registers.

* * * * *